United States Patent
Hou et al.

(10) Patent No.: US 12,152,824 B2
(45) Date of Patent: Nov. 26, 2024

(54) SYSTEM FOR SUPPRESSING ELECTROMAGNETIC INTERFERENCE OF REFRIGERANT RADIATOR AND HOUSEHOLD APPLIANCE

(71) Applicants: Guangdong Midea White Home Appliance Technology Innovation Center Co., Ltd., Foshan (CN); MIDEA GROUP CO., LTD., Foshan (CN)

(72) Inventors: Junfeng Hou, Foshan (CN); Dingjun Liang, Foshan (CN); Jian Hu, Foshan (CN)

(73) Assignees: Guangdong Midea White Home Appliance Technology Innovation Center Co., Ltd., Foshan (CN); MIDEA GROUP CO., LTD., Foshan (CN)

(*) Notice: Subject to any disclaimer, the term of this patent is extended or adjusted under 35 U.S.C. 154(b) by 804 days.

(21) Appl. No.: 17/292,004

(22) PCT Filed: Dec. 24, 2018

(86) PCT No.: PCT/CN2018/123210
§ 371 (c)(1),
(2) Date: May 7, 2021

(87) PCT Pub. No.: WO2020/103276
PCT Pub. Date: May 28, 2020

(65) Prior Publication Data
US 2022/0011039 A1   Jan. 13, 2022

(30) Foreign Application Priority Data

Nov. 19, 2018  (CN) .................. 201811376791.2

(51) Int. Cl.
F25D 19/00 (2006.01)
H03H 7/01 (2006.01)
H03H 7/06 (2006.01)

(52) U.S. Cl.
CPC ......... F25D 19/006 (2013.01); H03H 7/0115 (2013.01); H03H 7/06 (2013.01)

(58) Field of Classification Search
None
See application file for complete search history.

(56) References Cited

U.S. PATENT DOCUMENTS

2006/0152912 A1   7/2006  Karrer et al.
2018/0162373 A1*  6/2018  Colavincenzo ..... B60L 15/2054

FOREIGN PATENT DOCUMENTS

CN    1913767 A    2/2007
CN    101031197 A   9/2007
(Continued)

OTHER PUBLICATIONS

International Search Report, International application No. PCT/CN2018/123210, mailed Aug. 21, 2019 (11 pages).
(Continued)

Primary Examiner — Cassandra F Cox

(57) ABSTRACT

A system for suppressing the electromagnetic interference of a refrigerant radiator and a household appliance, the system including: a refrigerant radiator, a drive circuit corresponding to the refrigerant radiator, a metal conductor and a filter unit; the metal conductor is separately connected to the filter unit and the refrigerant radiator, the filter unit is connected to the drive circuit, and an electromagnetic interference closed-loop circuit is formed between the refrigerant radiator, the metal conductor, the filter unit and the drive circuit corresponding to the refrigerant radiator.

18 Claims, 4 Drawing Sheets

(56) References Cited

FOREIGN PATENT DOCUMENTS

| CN | 103186174 A | 7/2013 |
|---|---|---|
| CN | 206117490 U | 4/2017 |
| CN | 107178895 A | 9/2017 |
| CN | 107493672 A | 12/2017 |
| CN | 206743047 U | 12/2017 |
| CN | 107800287 A | 3/2018 |
| CN | 108253553 A | 7/2018 |
| CN | 108650789 A | 10/2018 |
| CN | 208047146 U | 11/2018 |
| EP | 2840693 A2 | 2/2015 |

OTHER PUBLICATIONS

First Office Action from China patent office in a counterpart Chinese patent Application 201811376791.2, mailed 2 Nov. 6, 2020 (19 pages).
"Advanced Materials and Design for Electromagnetic Interference Shielding", Xingcun Colin Tong: "7 Board-Level Shielding Materials and Components", Jan. 1, 2008, pp. 177-216(37 pages).
European Search Report, Application No. 18940567.3, mailed Oct. 5, 2021(9 pages).

\* cited by examiner

SYSTEM FOR SUPPRESSING ELECTROMAGNETIC INTERFERENCE OF REFRIGERANT RADIATOR AND HOUSEHOLD APPLIANCE

CROSS-REFERENCES TO RELATED APPLICATIONS

The present disclosure is a national phase application of International Application No. PCT/CN2018/123210, filed on Dec. 24, 2018, which claims priority of Chinese Patent Application No. 201811376791.2, filed on Nov. 19, 2018, the entireties of which are herein incorporated by reference.

FIELD

The present disclosure relates to the field of household appliances, and in particular to a system for suppressing electromagnetic interference of refrigerant radiator and a household appliance.

BACKGROUND

At present, the method of using refrigerants to dissipate heat from power components is widely used. Many household appliances use refrigerants to dissipate heat instead of air-cooling heat dissipation. The electromagnetic interference generated by the power components during operations will be coupled to the refrigerant radiator, and the electromagnetic environment becomes extremely complicated. It is easy to cause strong electromagnetic interference. In addition, household appliances must pass Electro Magnetic Compatibility (EMC) test to obtain an EMC certification in accordance with standards or specified requirements before they can be sold on the market.

In the related art, the filtering effect of the filter unit is limited, and it is difficult to make the household appliances pass the EMC test. To reduce the electromagnetic interference of household appliances, filter components such as common mode inductors and refrigerant pipes and magnetic rings adapted to the refrigerant radiator are usually added to the input end of the power supply to suppress the electromagnetic interference. However, the use of common mode inductors and magnetic rings increases production cost of household appliances. Moreover, when the number of magnetic rings is large, the installation process of the household appliances may become complicated, which may lead to a decrease in production efficiency.

Therefore, how to propose a system for suppressing the electromagnetic interference of the refrigerant radiator, which can reduce the electromagnetic interference of the refrigerant radiator and the production cost of household appliances, has become an important issue that needs to be solved in the industry.

SUMMARY

In view of the shortcomings in the prior art, the embodiments of the present disclosure provide a system and a household appliance that suppress electromagnetic interference of a refrigerant radiator.

In one embodiment of the present disclosure, a system for suppressing electromagnetic interference of a refrigerant radiator is provided. The system includes a refrigerant radiator, a drive circuit corresponding to the refrigerant radiator, a metal conductor, and a filter unit. The metal conductor is respectively connected to the filter unit and the refrigerant radiator. The filter unit is connected to the drive circuit. A closed-loop of electromagnetic interference is formed among the refrigerant radiator, the metal conductor, the filter unit, and the drive circuit corresponding to the refrigerant radiator.

In one embodiment, the system includes metal conductors and filter units. Each of the metal conductors corresponds to a corresponding filter unit of the filters. Each of the metal conductors connects a corresponding filter unit with the refrigerant radiator. Each of the filter units is connected to the drive circuit. A closed-loop of electromagnetic interference is formed among the refrigerant radiator, each of the metal conductors, the filter unit corresponding to each of the metal conductors, and the drive circuit corresponding to the refrigerant radiator.

In one embodiment, the filter unit is connected to P terminal (positive terminal of bus bar) or N terminal (negative terminal of bus bar) of a DC power supply of the drive circuit.

In one embodiment, the filter unit includes a capacitor.

In one embodiment, the filter unit includes a capacitor and a resistor connected in series, one end of the capacitor and the resistor connected in series is connected to the metal conductor, the other end of the capacitor and the resistor connected in series is connected to the drive circuit.

In one embodiment, the filter unit includes a capacitor and an inductor connected in series. One end of the capacitor and the inductor connected in series is connected to the metal conductor, the other end of the capacitor and the inductor connected in series is connected to the drive circuit.

In one embodiment, the filter unit includes a capacitor, an inductor and a resistor connected in series; the inductor and the resistor are connected in parallel and then connected in series with the capacitor. One end of circuit formed by the capacitor, the inductor and the resistor is connected to the metal conductor, and the other end of the circuit is connected with the drive circuit.

In one embodiment, the metal conductor is a metal wire or a sheet metal parts.

In another embodiment of the present disclosure, a system for suppressing electromagnetic interference of a refrigerant radiator is provided. The system comprises a refrigerant radiator, a power component corresponding to the refrigerant radiator, a metal box of an electric control box, and at least one metal conductor. The power component is disposed in the metal box. The at least one metal conductor connects the refrigerant radiator with the metal box. A closed-loop of electromagnetic interference is formed among the refrigerant radiator, the metal conductor, the metal box, and the power component.

In one embodiment, the metal conductor is a metal wire or a sheet metal parts.

In some embodiment of the present disclosure, a household appliance for suppressing electromagnetic interference of a refrigerant radiator is provided. The household appliance comprises a system for suppressing electromagnetic interference of a refrigerant radiator as described in any of the above embodiments.

The system for suppressing electromagnetic interference of the refrigerant radiator and the household appliance provided by the embodiments of the present disclosure, including a refrigerant radiator, a metal conductor, a filter unit and a drive circuit corresponding to the refrigerant radiator. The metal conductor is connected to the filter unit and the refrigerant radiator. The filter unit is connected to the drive circuit. Thus, a closed-loop of electromagnetic interference is formed among the refrigerant radiator, the metal conductor, the filter unit, and the drive circuit corresponding to the refrigerant radiator, which can reduce the electromagnetic interference of the refrigerant radiator and reduce the production cost of the household appliance.

BRIEF DESCRIPTION OF THE DRAWINGS

In order to describe embodiments of the present disclosure more clearly, the drawings used for the description of the embodiments will be described. The following drawings are only some embodiments of the present disclosure.

Figure 1:
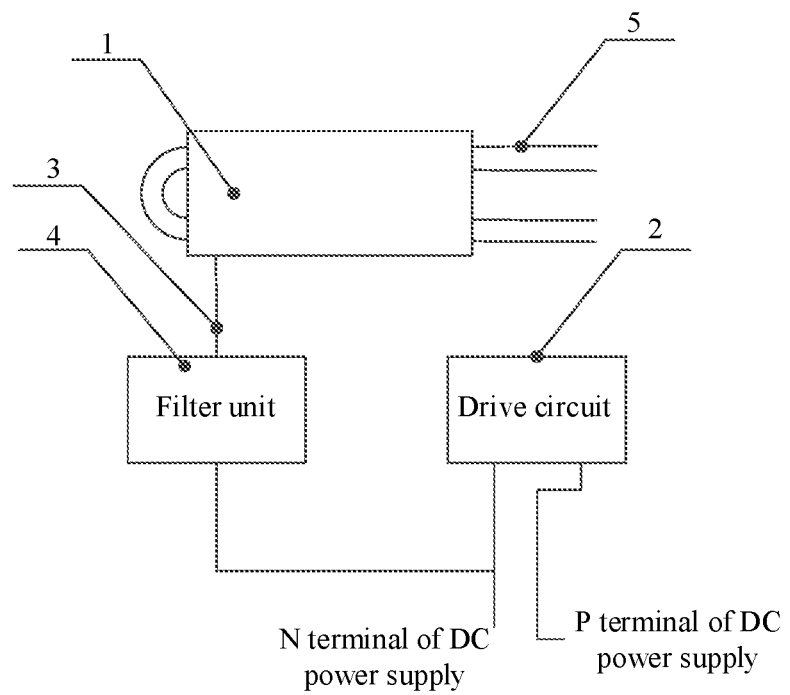
FIG. 1 is a schematic structural diagram of a system for suppressing electromagnetic interference of refrigerant radiators according to a first embodiment of the present disclosure.

The labels in the drawings are described as follows:

| 1-Refrigerant radiator; | 2-Drive circuit; |
|---|---|
| 3-Metal conductor; | 4-Filter unit; |
| 5-Refrigerant pipe; | 81-Refrigerant radiator; |
| 82-Power component; | 83-Metal box; |
| 84-Metal conductor; | 85-Refrigerant pipe. |

DETAILED DESCRIPTION OF THE DISCLOSURE

Embodiments in the present disclosure will be described clearly and completely with reference to the accompanying drawings. The described embodiments are only some embodiments of the present disclosure.

FIG. 1 is a schematic structural diagram of a system for suppressing electromagnetic interference of refrigerant radiators according to a first embodiment of the present disclosure. As shown in FIG. 1, the system includes a refrigerant radiator 1, a drive circuit 2 corresponding to the refrigerant radiator 1, a metal conductor 3, and a filter unit 4. The metal conductor 3 is respectively connected to the filter unit 4 and the refrigerant radiator 1. The filter unit 4 is connected to the drive circuit 2. A closed-loop of electromagnetic interference can be formed among the refrigerant radiator 1, the metal conductor 3, the filter unit 4, and the drive circuit 2 corresponding to the refrigerant radiator 1.

In one embodiment, a power component of the drive circuit 2 may be fixed on the refrigerant radiator 1, so that the refrigerant radiator 1 can be in contact with the power component. The power component and the refrigerant radiator can be electrically insulated. The refrigerant radiator 1 can cool the power components on the drive circuit 2 through the refrigerant in the refrigerant pipe 5. The refrigerant radiator 1 may be connected to a filter unit 4 through the metal conductor 3. The metal conductor 3 may be a metal wire or a sheet metal parts. The sheet metal parts may be made of metal materials such as copper, iron, aluminum, etc. The sheet metal parts have functions of electric conduction and magnetic conduction. The filter unit 4 can be connected to P terminal (positive terminal of bus bar) or N terminal (negative terminal of bus bar) of a DC power supply of the drive circuit 2 to establish a connection with the drive circuit 2. A closed-loop of electromagnetic interference can be formed among the refrigerant radiator 1, the metal conductor 3, the filter unit 4 and the drive circuit 2. In addition, the specific installation position of the refrigerant radiator 1 can be set according to actual needs, which is not limited in the embodiment of the present disclosure. The specific position of the filter unit 4 also can be set according to actual needs, which is not limited in the embodiment of the present disclosure, for example, the filter unit 4 can be set in an electric control box.

Electromagnetic interference can be generated during operation of the drive circuit 2. The electromagnetic interference can be coupled to the refrigerant radiator 1 through a power component on the drive circuit 2, and complex electromagnetic interference can be formed on the refrigerant radiator 1. The electromagnetic interference on the refrigerant radiator 1 may flows into the filter unit 4 through the metal conductor 3. Part of the electromagnetic interference can be eliminated by the filter unit 4, residual electromagnetic interference may flow back to the drive circuit 2 and be coupled into the refrigerant radiator 1, and a closed-loop of the electromagnetic interference may be formed among the refrigerant radiator 1, the metal conductor 3, the filter unit 4 and the drive circuit 2. The electromagnetic interference can be limited in the closed-loop with low impedance. The electromagnetic interference of the refrigerant radiator 1 may be reduced. The system for suppressing the electromagnetic interference of the refrigerant radiator provided by the embodiment of the present disclosure can pass the EMC test easily. The amount of common mode inductor and magnetic ring used is also reduced, and the production cost of the household appliance can be reduced. In addition, the system for suppressing electromagnetic interference of the refrigerant radiator provided by the embodiment of the disclosure can utilize the existing refrigerant radiator and the drive circuit by adding metal conductors and filter units. The system is simple in structure and easy to install and implement, improving production efficiency of the household appliances.

The system for suppressing the electromagnetic interference of the refrigerant radiator includes a refrigerant radiator, a metal conductor, a filter unit and a drive circuit corresponding to the refrigerant radiator. The metal conductor is respectively connected to the filter unit and the refrigerant radiator. The filter unit is connected to the drive circuit. A closed-loop of electromagnetic interference can be formed among the refrigerant radiator, the metal conductor, the filter unit and the drive circuit corresponding to the refrigerant radiator, and the electromagnetic interference of the refrigerant radiator can be reduced. The production cost of household appliances can be reduced.

Figure 2:
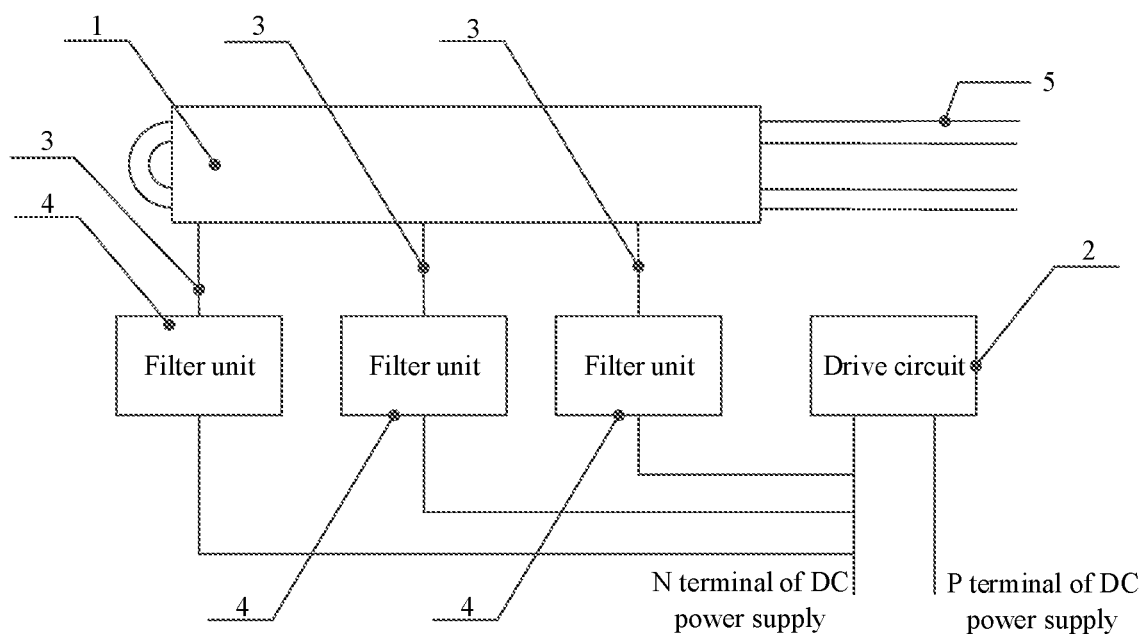
FIG. 2 is a schematic structural diagram of a system for suppressing electromagnetic interference of refrigerant radiators according to a second embodiment of the present disclosure.

FIG. 2 is a schematic structural diagram of a system for suppressing electromagnetic interference of a refrigerant radiator according to a second embodiment of the present disclosure. As shown in FIG. 2, on the basis of the above embodiments, the system further comprises metal conductors 3 and filter units 4. Each of the metal conductors 3 corresponds to a corresponding filter unit of the filter units 4. Each metal conductor 3 connects a corresponding filter unit 4 to the refrigerant radiator 1. Each filter unit 4 can be connected to P terminal or N terminal of a DC power supply of the drive circuit 2. A closed-loop of electromagnetic interference can be formed among the refrigerant radiator 1, each metal conductor 3, the filter unit 4 corresponding to each metal conductor 3, and the drive circuit 2 corresponding to the refrigerant radiator 1. In one embodiment, the filter unit 4 connected with the metal conductor 3 is the filter unit 4 corresponding to the metal conductor 3. Since the shape of the refrigerant radiator 1 may cause uneven electromagnetic interference distribution, metal conductors 3 and filter units 4 can be arranged between the drive circuit 2 and the refrigerant radiator 1. As a result, closed-loops of electromagnetic interference can be formed among the drive circuit 2 and the refrigerant radiator 1 to improve the effect of suppressing the electromagnetic interference of the refrigerant radiator 1. The connection position of the metal conductor and the refrigerant radiator can be set according to actual needs, which is not limited in the embodiments of the present disclosure.

Figure 3:
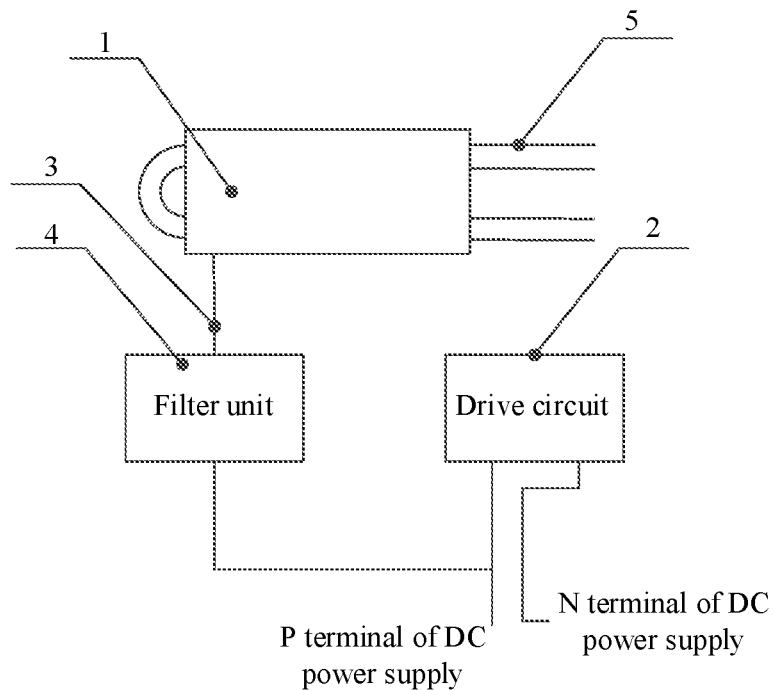
FIG. 3 is a schematic structural diagram of a system for suppressing electromagnetic interference of refrigerant radiators according to a third embodiment of the present disclosure.

FIG. 3 is a schematic structural diagram of a system for suppressing electromagnetic interference of a refrigerant radiator according to a third embodiment of the present disclosure. As shown in FIG. 1 and FIG. 3, the filter unit 4 may be further connected with P terminal or N terminal of the DC power supply of the drive circuit 2. Referring to FIG. 3, the filter unit 4 is connected with the P terminal of the DC power source of the drive circuit 2. Referring to FIG. 1, the filter unit 4 is connected with the N terminal of the DC power source of the drive circuit 2. Thus, the connection between the filter unit 4 and the drive circuit 2 can be established, forming a closed-loop of electromagnetic interference.

Figure 4:
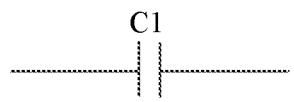
FIG. 4 is a schematic circuit structural diagram of the filter unit according to a fifth embodiment of the present disclosure.

FIG. 4 is a schematic circuit structure diagram of a filter unit according to a fifth embodiment of the present disclosure. As shown in FIG. 4, on the basis of the above embodiments, the filter unit 4 further includes a capacitor C1. One end of the capacitor C1 is connected to the metal conductor 3, the other end of the capacitor C1 is connected to P terminal or N terminal of DC power supply of the drive circuit 2. In this case, the capacitor can be adopted as the filter unit, which is simple and easy to implement. The production cost of the household appliance also can be reduced.

Figure 5:
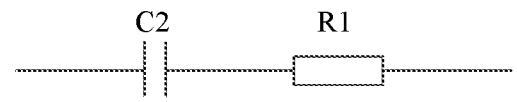
FIG. 5 is a schematic circuit structural diagram of the filter unit according to a sixth embodiment of the present disclosure.

FIG. 5 is a schematic circuit structure diagram of a filter unit according to a sixth embodiment of the present disclosure. As shown in FIG. 5, on the basis of the above embodiments, the filter unit 4 further includes a capacitor C2 and a resistor R1 connected in series. One end of the capacitor C2 and the resistor R1 connected in series is connected to the metal conductor 3, the other end of the capacitor C2 and the resistor R1 connected in series is connected to P terminal or N terminal of DC power supply of the drive circuit 2. In this case, the series capacitor C2 and the resistor R1 connected in series are adopted as a filter unit, which is simple and easy to implement. The production cost of the household appliance also can be reduced.

Figure 6:
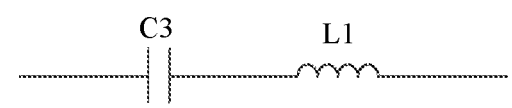
FIG. 6 is a schematic circuit structural diagram of the filter unit according to a seventh embodiment of the present disclosure.

FIG. 6 is a schematic circuit structure diagram of a filter unit according to a seventh embodiment of the present disclosure. As shown in FIG. 6, on the basis of the above embodiments, the filter unit 4 further includes a capacitor C3 and an inductor L1 connected in series. One end of the capacitor C3 and the inductor L1 connected in series is connected to the metal conductor 3, the other end of the capacitor C3 and the inductor L1 connected in series is connected to P terminal or N terminal of DC power supply of the drive circuit 2. In this case, the capacitor C3 and the inductor L1 connected in series are adopted as the filter unit, which is simple and easy to implement. The production cost of the household appliance also can be reduced.

Figure 7:
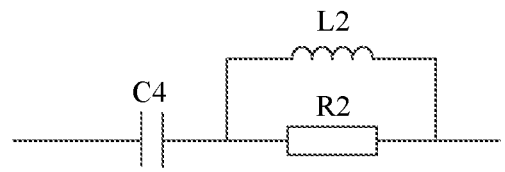
FIG. 7 is a schematic circuit structural diagram of the filter unit according to an eighth embodiment of the present disclosure.

FIG. 7 is a schematic circuit structure diagram of a filter unit according to an eighth embodiment of the present disclosure. As shown in FIG. 7, the filter unit 4 includes a capacitor C4, an inductor L2, and a resistor R2. The inductor L2 is in parallel with the resistor R2, then the inductor L2 and the resistor R2 can be connected in series with the capacitor C4. One end of circuit formed by the capacitor C4, the inductor L2, and the resistor R2 can be connected to the metal conductor 3, the other end of the circuit formed by the capacitor C4, the inductor L2, and the resistor R2 can be connected to P terminal or N terminal of DC power supply of the drive circuit 2. In this case, the circuit composed of the capacitor C4, the inductor L2 and the resistor R2 can be adopted as the filter unit, which is simple and easy to implement. The production cost of the household appliance also can be reduced.

In addition to the above embodiments, the metal conductor 3 may be a metal wire or a sheet metal parts. The sheet metal parts have functions of electric conduction and magnetic conduction. The sheet metal parts can be made of metal materials such as copper, iron, aluminum, etc.

Figure 8:
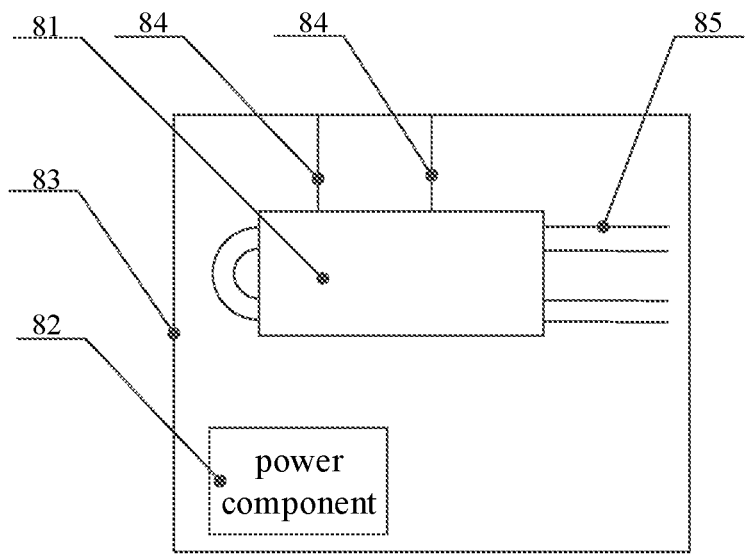
FIG. 8 is a schematic structural diagram of an apparatus for collecting a fingerprint according to a ninth embodiment of the present disclosure.

FIG. 8 is a schematic structural diagram of a system for suppressing electromagnetic interference of a refrigerant radiator according to a ninth embodiment of the present disclosure. As shown in FIG. 8, the system for suppressing electromagnetic interference of a refrigerant radiator according to the embodiment of the present disclosure includes a refrigerant radiator 81, a power component 82 corresponding to the refrigerant radiator 81, a metal box 83 of an electronic control box and at least one metal conductor 84. The power component 82 is disposed in the metal box 83. The at least one metal conductor 84 connects the refrigerant radiator 81 and the metal box 83. A closed-loop of electromagnetic interference can be formed among the refrigerant radiator 81, the metal conductor 84, the metal box 83 and the power component 82.

In one embodiment, the electronic control box is a metal box. A circuit board is arranged in the metal box 83 of the electronic control box. The power component 82 is arranged on the circuit board. The refrigerant radiator 81 may be in contact with the power component 82. The power component 82 may be cooled by refrigerant in the refrigerant pipe 85. The refrigerant radiator 81 is connected to the metal box 83 through at least one metal conductor 84. The metal conductor 84 may be a metal wire or a sheet metal parts. The sheet metal parts have functions of electric conduction and magnetic conduction. The sheet metal parts may be made of metal materials such as copper, iron, aluminum, etc. The specific installation position of the refrigerant radiator 81 may be set according to actual needs. The embodiment of the disclosure may not be limited. The specific position of the metal conductor 84 may be set according to actual needs, which is not limited in the embodiments of the present disclosure.

The power component 82 may generate electromagnetic interference during operation. The electromagnetic interference can be coupled to the refrigerant radiator 81 to cause complex electromagnetic interference formed on the refrigerant radiator 81. The metal conductor 84 can transmit the electromagnetic interference on the refrigerant radiator 81 to the metal box 83. The electromagnetic interference on the metal box 83 may be coupled back to the power component 82 and then coupled into the refrigerant radiator 81. A closed-loop of electromagnetic interference can be formed among the refrigerant radiator 81, the metal conductor 84, the metal box 83 and the power component 82. The electromagnetic interference can be limited in the low-impedance closed-loop. The electromagnetic interference of the refrigerant radiator 81 can be reduced. Since the shape of the refrigerant radiator 81 may cause uneven electromagnetic interference distribution. Metal conductors 84 may be disposed at different positions on the refrigerant radiator 81 to form closed-loops of electromagnetic interference, to improve the effect of suppressing the electromagnetic interference of the refrigerant radiator 81.

A system for suppressing the electromagnetic interference of the refrigerant radiator provided by the embodiment of the present disclosure can easily pass EMC test, which can reduce the use of common-mode inductor and magnetic ring, to reduce the production cost of household appliances. In addition, the system for suppressing the electromagnetic interference of the refrigerant radiator provided by the embodiment of the present disclosure can utilize the metal box of the existing electric control box by adding metal conductors, which is simple in structure and easy to install and implement, improving the production efficiency of household appliances.

On the basis of the foregoing embodiments, the metal conductor 84 can be a metal wire or a sheet metal parts. The sheet metal parts have functions of electric conduction and magnetic conduction. The sheet metal parts can be made of metal materials such as copper, iron, aluminum and the like.

Figure 9:
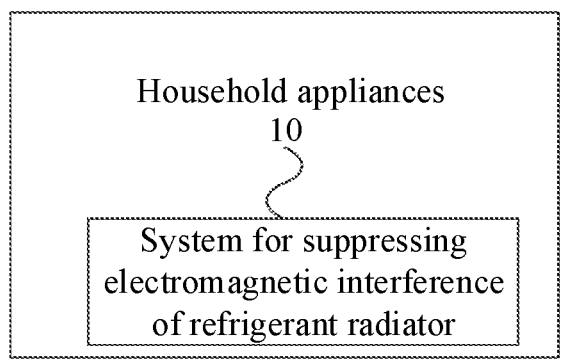
FIG. 9 is a schematic structural diagram of a household appliance provided by an embodiment of the present disclosure.

FIG. 9 is a schematic structural diagram of a household appliance according to an embodiment of the present disclosure. As shown in FIG. 9, the household appliance of the present disclosure includes a system 10 for suppressing the electromagnetic interference of the refrigerant radiator according to any of the embodiments described above. In one embodiment, the household appliances may be, for example, air conditioners, washing machines, refrigerators, and the like.

Figure 10:
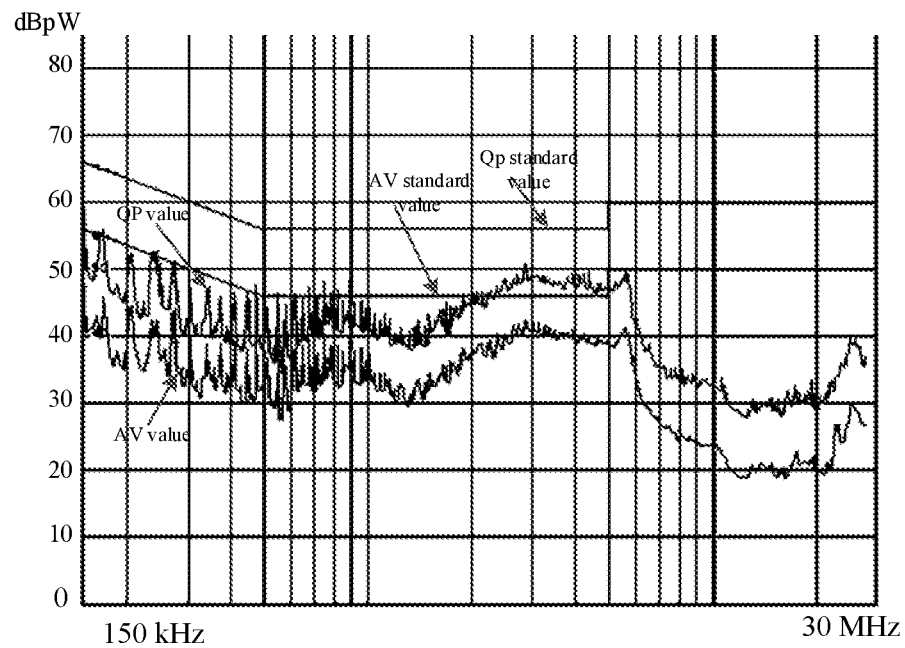
FIG. 10 is a schematic diagram of an electromagnetic interference curve of a related household appliance according to an embodiment of the present disclosure.
Figure 11:
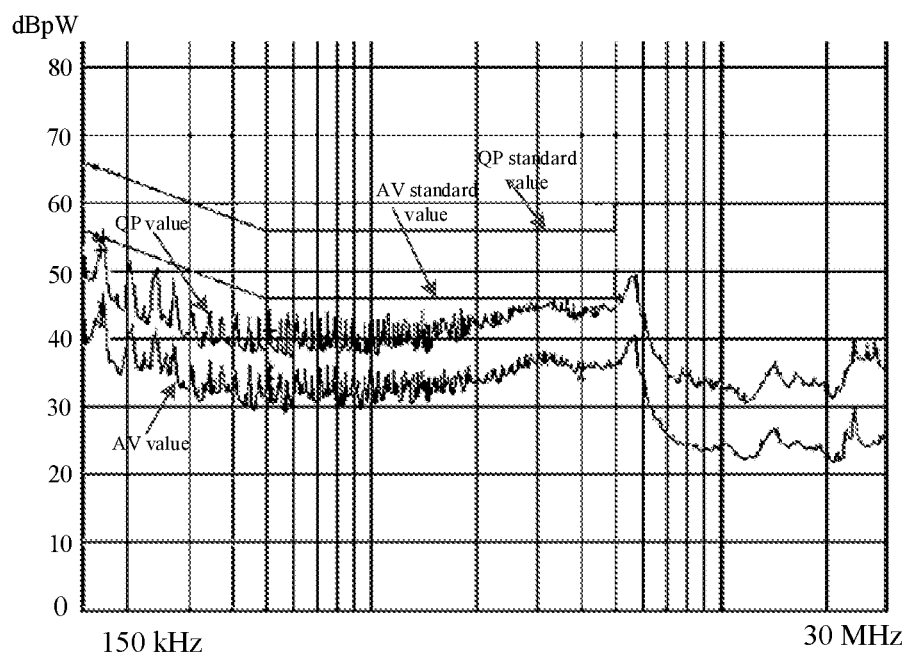
FIG. 11 is a schematic diagram of an electromagnetic interference curve of a household appliance after using a system for suppressing electromagnetic interference of a refrigerant radiator according to an embodiment of the present disclosure.

FIG. 10 is a schematic diagram of an electromagnetic interference curve of a related household appliance according to an embodiment of the present disclosure. FIG. 11 is a schematic diagram of an electromagnetic interference curve of a household appliance after using a system for suppressing electromagnetic interference of a refrigerant radiator according to an embodiment of the present disclosure. It can be seen that the system for suppressing the electromagnetic interference of the refrigerant radiator provided by the embodiments of the present disclosure has an effect of suppressing electromagnetic interference of the refrigerant radiator. The system has a great electromagnetic compatibility performance.

It should be noted that, different refrigerant radiators may have different installation conditions. The system for suppressing the electromagnetic interference of the DC motor shown in FIG. 1, FIG. 2, FIG. 3 and FIG. 8 may be selected alternatively. The filter unit also can be selected from filter units shown in FIG. 4 to FIG. 7 alternatively. Thus, the purpose of effectively suppressing electromagnetic interference generated by the refrigerant radiator can be achieved.

What is claimed is:

1. A system for suppressing electromagnetic interference of a refrigerant radiator, comprising:
   a refrigerant radiator;
   a power component corresponding to the refrigerant radiator;
   a metal box of an electric control box; and
   at least one metal conductor;
   wherein the power component is disposed in the metal box;
   the at least one metal conductor connects the refrigerant radiator with the metal box;
   a closed-loop of electromagnetic interference is formed among the refrigerant radiator, the metal conductor, the metal box, and the power component.

2. The system according to claim 1, wherein the metal conductor is a metal wire or a sheet metal parts.

3. The system according to claim 1 further comprises:
   a drive circuit corresponding to the refrigerant radiator; and
   a filter unit;
   wherein the metal conductor is respectively connected to the filter unit and the refrigerant radiator, the filter unit is connected to the drive circuit, the closed-loop of electromagnetic interference further comprises the filter unit and the drive circuit corresponding to the refrigerant radiator.

4. The system according to claim 3, wherein the system comprises a plurality of metal conductors and a plurality of filter units, each of the metal conductors corresponds to a corresponding filter unit of the filter units;
   each of the metal conductors connects the corresponding filter unit with the refrigerant radiator;
   each of the filter units is connected to the drive circuit; and
   a closed-loop of electromagnetic interference is formed among the refrigerant radiator, each of the metal conductors, the filter unit corresponding to each of the metal conductors, and the drive circuit corresponding to the refrigerant radiator.

5. The system according to claim 3, wherein the filter unit is connected to P terminal or N terminal of a DC power supply of the drive circuit.

6. The system according to claim 3, wherein the filter comprises a capacitor.

7. The system according to claim 3, wherein the filter unit comprises a capacitor and a resistor connected in series, a first end of the capacitor and the resistor connected in series is connected to the metal conductor, a second end of the capacitor and the resistor connected in series is connected to the drive circuit.

8. The system according to claim 3, wherein the filter unit comprises a capacitor and an inductor connected in series, a first end of the capacitor and the inductor connected in series is connected to the metal conductor, and a second end of the capacitor and the inductor connected in series is connected to the drive circuit.

9. The system according to claim 3, wherein the filter unit comprises a capacitor, an inductor, and a resistor;
  the inductor and the resistor are connected in parallel and then connected in series with the capacitor;
  wherein a first end of drive circuit formed by the capacitor, the inductor and the resistor is connected to the metal conductor;
  a second end of the drive circuit is connected with the drive circuit.

10. The system according to claim 3, wherein the metal conductor is a metal wire or a sheet metal parts.

11. A household appliance, comprising a system for inhibiting electromagnetic interference of a refrigerant radiator comprising:
  a refrigerant radiator;
  a drive circuit corresponding to the refrigerant radiator;
  a metal conductor;
  a filter unit;
  a metal box of an electric control box; and
  a power component disposed in the metal box and corresponding to the refrigerant radiator;
  wherein the metal conductor is respectively connected to the filter unit and the refrigerant radiator, the filter unit is connected to the drive circuit, a closed-loop of electromagnetic interference is formed among the refrigerant radiator, the metal conductor, the filter unit, the metal box, the power component, and the drive circuit corresponding to the refrigerant radiator;
  wherein the metal conductor further connects the refrigerant radiator with the metal box.

12. The household appliance according to claim 11, wherein the system comprises a plurality of metal conductors and a plurality of filter units, each of the metal conductors corresponds to a corresponding filter unit of the filter units;
  each of the metal conductors connects the corresponding filter unit with the refrigerant radiator;
  each of the filter units is connected to the drive circuit; and
  a closed-loop of electromagnetic interference is formed among the refrigerant radiator, each of the metal conductors, the filter unit corresponding to each of the metal conductors, and the drive circuit corresponding to the refrigerant radiator.

13. The household appliance according to claim 11, wherein the filter unit is connected to P terminal or N terminal of a DC power supply of the drive circuit.

14. The household appliance according to claim 11, wherein the filter unit comprises a capacitor.

15. The household appliance according to claim 11, wherein the filter unit comprises a capacitor and a resistor connected in series, a first end of the capacitor and the resistor connected in series is connected to the metal conductor, a second end of the capacitor and the resistor connected in series is connected to the drive circuit.

16. The household appliance according to claim 11, wherein the filter unit comprises a capacitor and an inductor connected in series, a first end of the capacitor and the inductor connected in series is connected to the metal conductor, and a second end of the capacitor and the inductor connected in series is connected to the drive circuit.

17. The household appliance according to claim 11, wherein the filter unit comprises a capacitor, an inductor, and a resistor;
  the inductor and the resistor are connected in parallel and then connected in series with the capacitor;
  wherein one end of circuit formed by the capacitor, the inductor and the resistor is connected to the metal conductor;
  a second end of the drive circuit is connected with the drive circuit.

18. The household appliance according to claim 11, wherein the metal conductor is a metal wire or a sheet metal parts.

* * * * *